(12) United States Patent
No et al.

(10) Patent No.: US 9,437,580 B1
(45) Date of Patent: Sep. 6, 2016

(54) SEMICONDUCTOR PACKAGES WITH METAL POSTS, MEMORY CARDS INCLUDING THE SAME, AND ELECTRONIC SYSTEMS INCLUDING THE SAME

(71) Applicant: SK hynix Inc., Icheon-si Gyeonggi-do (KR)

(72) Inventors: Ga Hyun No, Cheongju-si (KR); Chan Woo Jeong, Chungju-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 14/835,589

(22) Filed: Aug. 25, 2015

(30) Foreign Application Priority Data

Apr. 13, 2015 (KR) .................. 10-2015-0052036

(51) Int. Cl.
| | |
|---|---|
| *H01L 25/065* | (2006.01) |
| *H01L 23/28* | (2006.01) |
| *H01L 23/498* | (2006.01) |
| *H01L 23/31* | (2006.01) |
| *H01L 23/29* | (2006.01) |
| *H01L 23/14* | (2006.01) |

(52) U.S. Cl.
CPC ......... *H01L 25/0657* (2013.01); *H01L 23/145* (2013.01); *H01L 23/293* (2013.01); *H01L 23/296* (2013.01); *H01L 23/3107* (2013.01); *H01L 23/3128* (2013.01); *H01L 23/4985* (2013.01); *H01L 23/49827* (2013.01); *H01L 2225/06548* (2013.01); *H01L 2225/06555* (2013.01)

(58) Field of Classification Search
CPC ............................................ H01L 2225/06548
See application file for complete search history.

(56) References Cited

U.S. PATENT DOCUMENTS

2013/0154074 A1* 6/2013 Oh .................. H01L 21/561
257/676

FOREIGN PATENT DOCUMENTS

| KR | 1020110050028 A | 5/2011 |
|---|---|---|
| KR | 1020140133022 A | 11/2014 |

* cited by examiner

*Primary Examiner* — Stephen W Smoot
(74) *Attorney, Agent, or Firm* — William Park & Associates Ltd.

(57) ABSTRACT

A semiconductor package includes a flexible package substrate including a first surface and a second surface, a metal post penetrating the flexible package substrate from the first surface toward the second surface and including a first protrusion that protrudes from the first surface and a second protrusion that protrudes from the second surface, a first semiconductor chip connected to the first protrusion, a second semiconductor chip connected to the second protrusion, a first flexible molding member covering the first semiconductor chip and the first surface of the flexible package substrate, a second flexible molding member covering the second semiconductor chip disposed on the second surface of the flexible package substrate, and an external connection terminal disposed on the second surface of the flexible package substrate.

14 Claims, 7 Drawing Sheets

SEMICONDUCTOR PACKAGES WITH METAL POSTS, MEMORY CARDS INCLUDING THE SAME, AND ELECTRONIC SYSTEMS INCLUDING THE SAME

CROSS-REFERENCE TO RELATED APPLICATION

The present application claims priority under 35 U.S.C 119(a) to Korean Application No. 10-2015-0052036, filed on Apr. 13, 2015, in the Korean intellectual property Office, which is incorporated herein by reference in its entirety.

BACKGROUND

1. Technical Field

Various embodiments of the present disclosure relate to a packaging technology and, more particularly, to semiconductor packages employing metal posts as interconnection members, memory cards including the same, and electronic systems including the same.

2. Related Art

As electronic systems become scaled down with high performance and portable electronic systems are increasingly in demand, spaces where semiconductor devices occupy in the portable electronic systems have been reduced whereas multi-functional electronic systems have been required. Thus, compact and large capacity semiconductor memory devices have been continuously required. In addition, flexible electronic systems which are capable of bending or warping are increasingly in demand with increase of the interest in portable and wearable electronic systems.

The substrates or semiconductor chips may be thinly realized to be readily bent or warped. However, it is difficult to make interconnection members electrically coupling the semiconductor chips to the substrates to have flexibility. Tensile stress or compressive stress may be applied to the interconnection members connecting the semiconductor chips to the substrate when semiconductor packages including the interconnection members are warped or twisted. In the event that tensile stress or compressive stress is applied to the interconnection members, the interconnection members may be separated from connection pads or may be broken. If the interconnection members are separated from the connection pads or are broken, the semiconductor package may malfunction or the reliability of the semiconductor package may be degraded. Accordingly, package structure capable of maintaining the electrical connection of the interconnection members has been required even when the semiconductor chip or the substrate is warped or twisted.

SUMMARY

According to an embodiment, a semiconductor package includes a flexible package substrate including a first surface and a second surface. The semiconductor package also includes a metal post penetrating the flexible package substrate from the first surface toward the second surface and including a first protrusion that protrudes from the first surface and a second protrusion that protrudes from the second surface. The semiconductor package also includes a first semiconductor chip connected to the first protrusion. The semiconductor package also includes a second semiconductor chip connected to the second protrusion. The semiconductor package also includes a first flexible molding member covering the first semiconductor chip and the first surface of the flexible package substrate. The semiconductor package also includes a second flexible molding member covering the second semiconductor chip disposed on the second surface of the flexible package substrate. The semiconductor package also includes an external connection terminal disposed on the second surface of the flexible package substrate.

According to an embodiment, a semiconductor package includes a flexible package substrate including a first surface and a second surface. The semiconductor package also includes first stacked semiconductor chips stacked on the first surface of the flexible package substrate. The semiconductor package also includes second stacked semiconductor chips stacked on the second surface of the flexible package substrate. The semiconductor package also includes a plurality of metal posts penetrating the flexible package substrate and including protrusions that protrude from the first and second surfaces of the flexible package substrate. Further, the metal posts electrically couple the first stacked semiconductor chips to the second stacked semiconductor chips. The semiconductor package also includes a first flexible molding member covers the first stacked semiconductor chips and the first surface of the flexible package substrate. The semiconductor package also includes a second flexible molding member covers the second stacked semiconductor chips on the second surface of the flexible package substrate. The semiconductor package also includes an external connection terminal is disposed on the second surface of the flexible package substrate.

According to an embodiment, there is provided a memory card including a semiconductor package. The semiconductor package includes a flexible package substrate including a first surface and a second surface. The semiconductor package also includes a metal post penetrating the flexible package substrate from the first surface toward the second surface and including a first protrusion that protrudes from the first surface and a second protrusion that protrudes from the second surface. The semiconductor package also includes a first semiconductor chip connected to the first protrusion. The semiconductor package also includes a second semiconductor chip connected to the second protrusion. The semiconductor package also includes a first flexible molding member covering the first semiconductor chip and the first surface of the flexible package substrate. The semiconductor package also includes a second flexible molding member covering the second semiconductor chip disposed on the second surface of the flexible package substrate. The semiconductor package also includes an external connection terminal disposed on the second surface of the flexible package substrate.

According to an embodiment, there is provided a memory card including a semiconductor package. The semiconductor package includes a flexible package substrate including a first surface and a second surface. The semiconductor package also includes first stacked semiconductor chips stacked on the first surface of the flexible package substrate. The semiconductor package also includes second stacked semiconductor chips stacked on the second surface of the flexible package substrate. The semiconductor package also includes a plurality of metal posts penetrating the flexible package substrate and including protrusions that protrude from the first and second surfaces of the flexible package substrate. The metal posts electrically couple the first stacked semiconductor chips to the second stacked semiconductor chips. Further, a first flexible molding member covers the first stacked semiconductor chips and the first surface of the flexible package substrate. In addition, a second flexible molding member covers the second stacked semiconductor chips on the second surface of the flexible package substrate. An external connection terminal is disposed on the second surface of the flexible package substrate.

According to an embodiment, there is provided an electronic system including a semiconductor package. The semiconductor package includes a flexible package substrate including a first surface and a second surface. The semiconductor package also includes a metal post penetrating the flexible package substrate from the first surface toward the second surface and including a first protrusion that protrudes from the first surface and a second protrusion that protrudes from the second surface. The semiconductor package also includes a first semiconductor chip connected to the first protrusion.

The semiconductor package also includes a second semiconductor chip connected to the second protrusion. The semiconductor package also includes a first flexible molding member covering the first semiconductor chip and the first surface of the flexible package substrate. The semiconductor package also includes a second flexible molding member covering the second semiconductor chip disposed on the second surface of the flexible package substrate. Further, the semiconductor package includes an external connection terminal disposed on the second surface of the flexible package substrate.

According to an embodiment, there is provided an electronic system including a semiconductor package. The semiconductor package includes a flexible package substrate including a first surface and a second surface. The semiconductor package also includes first stacked semiconductor chips stacked on the first surface. The semiconductor package also includes second stacked semiconductor chips stacked on the second surface. The semiconductor package also includes a plurality of metal posts penetrating the package substrate and including protrusions that protrude from the first and second surfaces of the flexible package substrate. The metal posts electrically couple the first stacked semiconductor chips to the second stacked semiconductor chips. A first flexible molding member covers the first stacked semiconductor chips and the first surface. A second flexible molding member covers the second stacked semiconductor chips on the second surface. An external connection terminal is disposed on the second surface.

DETAILED DESCRIPTION

Figure 1:
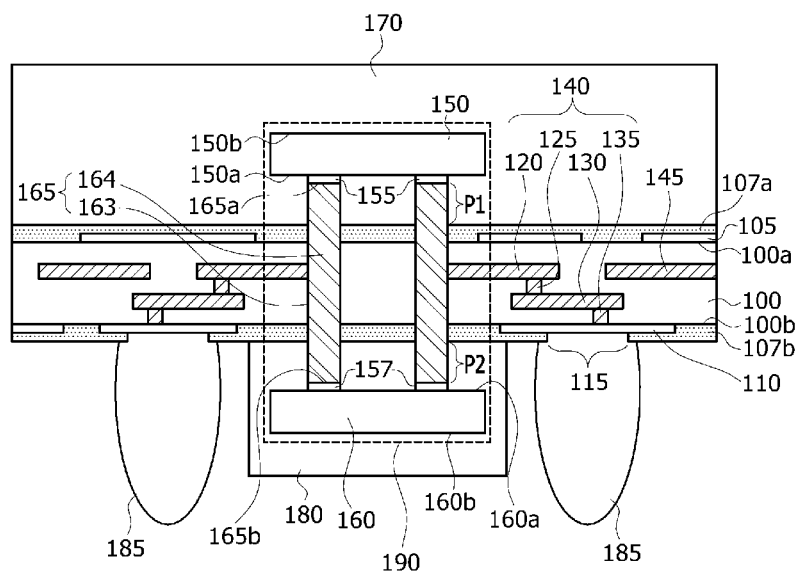
FIG. 1 is a cross-sectional view illustrating a semiconductor package according to an embodiment.

Various embodiments will now be described more fully hereinafter with reference to the accompanying figures; however, they may be embodied in different forms and should not be construed as limited to the embodiments set forth herein. Rather, these embodiments are provided so that this disclosure will be thorough and complete, and will fully convey the scope of the invention to those skilled in the art. Various embodiments are directed to semiconductor packages with metal posts, memory cards including the same, and electronic systems including the same.

Same reference numerals refer to same elements throughout the specification. Thus, even though a reference numeral is not mentioned or described with reference to a figure, the reference numeral may be mentioned or described with reference to another figure. In addition, even though the reference numerals are not shown in a figure, it may be mentioned or described with reference to another figure.

Figure 2:
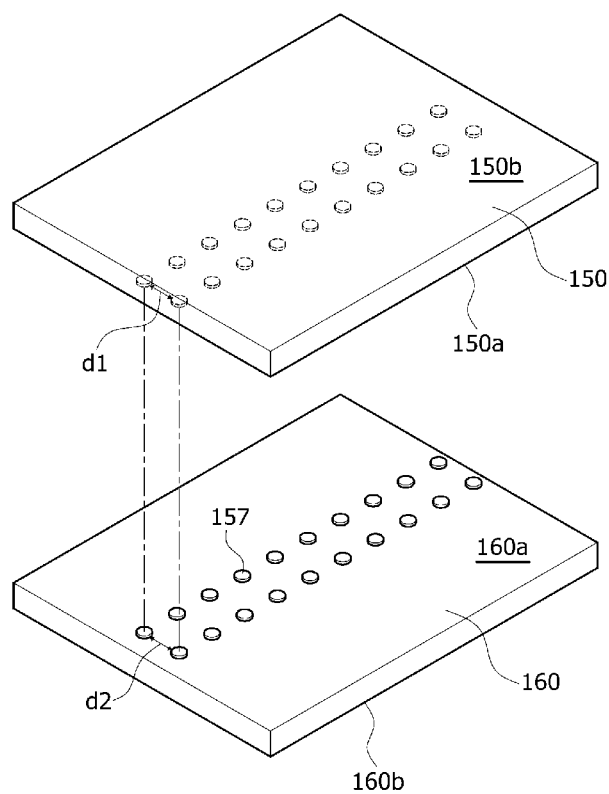
FIG. 2 is a schematic view illustrating semiconductor chips employed in the semiconductor package of FIG. 1.
Figure 3:
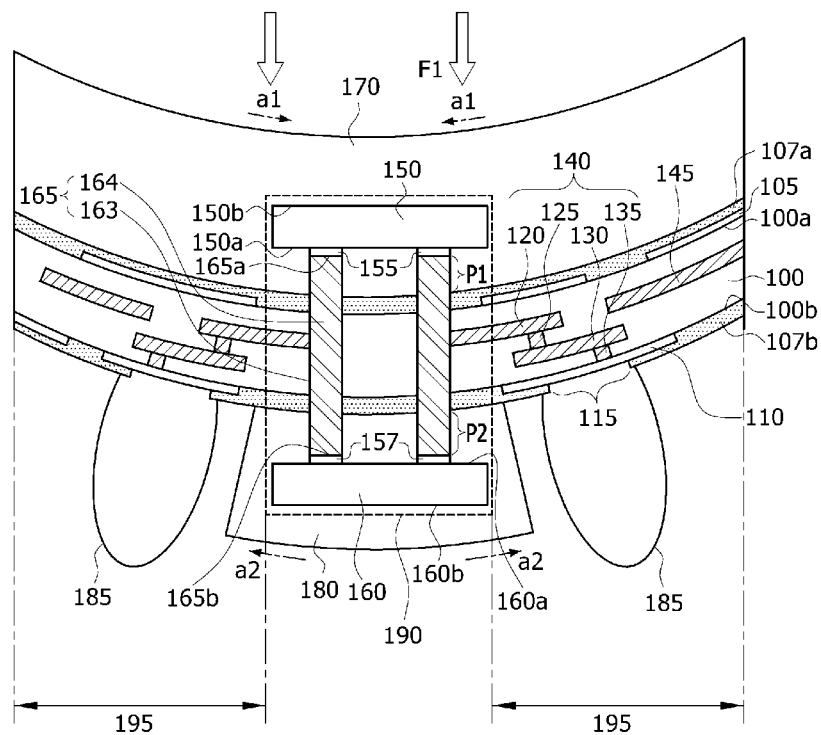
FIGS. 3 and 4 are cross-sectional views illustrating a stress relief action in the semiconductor package according to an embodiment.
Figure 4:
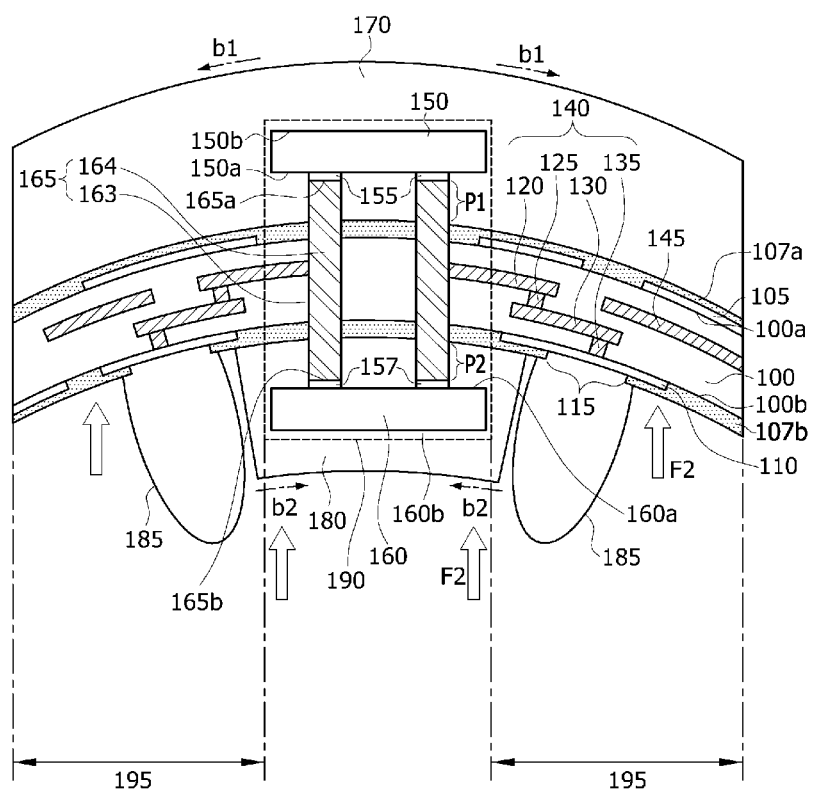

Referring to FIG. 1, a cross-sectional view illustrating a semiconductor package 1000 according to an embodiment is shown. Referring to FIG. 2, a schematic view illustrating semiconductor chips employed in the semiconductor package 1000 of FIG. 1 are shown. Referring to FIGS. 3 and 4, cross-sectional views illustrating a stress relief action in the semiconductor package according to an embodiment are illustrated.

Referring again to FIGS. 1 and 2, the semiconductor package 1000 may include a package substrate 100, first and second semiconductor chips 150 and 160 that are respectively disposed over and below the package substrate 100, and metal posts 165 penetrating the package substrate 100 to electrically couple the first and second semiconductor chips 150 and 160 to the package substrate 100.

The package substrate 100 may include a body and may be a plate type member having a first surface 100a and a second surface 100b that are opposite to each other. The package substrate 100 may be an organic substrate including a flexible organic material. In an embodiment, the organic material may include at least one of polymer resin, epoxy resin, and plastic. The body of the package substrate 100 may have a structure in which thin films including those organic materials described above are stacked. In addition, the package substrate 100 may be an insulation substrate including a flexible insulation material.

First circuit patterns 105 may be disposed on the first surface 100a of the package substrate 100. Further, second circuit patterns 110 may be disposed on the second surface 100b of the package substrate 100. The first circuit patterns 105 or the second circuit patterns 110 may be fabricated using a subtractive method or an additive method. In the subtractive method, the first and second circuit patterns 105 and 110 may be formed by disposing a copper foil on the body of the package substrate 100 and by etching the copper foil. Moreover, in the additive method, the first and second circuit patterns 105 and 110 may be directly formed on the first surface 100a and the second surface 100b of the package substrate 100 using a plating technique or the like. The package substrate 100 may be a lamination substrate in which a plurality of circuit substrates is laminated. The first circuit patterns 105 and the second circuit patterns 110 may include copper (Cu).

A first insulation pattern 107a and a second insulation pattern 107b may be disposed on the first surface 100a and the second surface 100b of the package substrate 100, respectively. The first insulation pattern 107a may be disposed to cover the first circuit patterns 105. The second insulation pattern 107b may be disposed to expose a portion of each of the second circuit patterns 110. The exposed portions of the second circuit patterns 110 may act as ball land pads 115. These first and insulation patterns 107a, 107b may include a solder resist material.

Wiring patterns 140 and 145 may be disposed in the body of the package substrate 100. The wiring patterns 140 and 145 may include first wiring patterns 140 and second wiring patterns 145. The first wiring pattern 140 may be connected to an external connection terminal 185 attached to the ball land pad 115 through the metal post 165. In an embodiment, as shown in FIG. 1, the first wiring pattern 140 may include a first metal pattern 120, a first via electrode 125, a second metal pattern 130, and a second via electrode 135. The first metal pattern 120 may contact a side wall of the metal post 165 and may extend in a predetermined direction inside the body of the package substrate 100. The second metal pattern 130 may be located below the first metal pattern 120 and may extend in a predetermined direction inside of the body of the package substrate 100. The first and second metal patterns 120 and 130 may be electrically coupled to each other through the first via electrode 125. The first via electrode 125 may be connected to the first metal pattern 120 and may be connected to the second metal pattern 130 by vertically penetrating a portion of the body of the package substrate 100. The second metal pattern 130 may be electrically coupled to the ball land pad 115 through the second via electrode 135. The second via electrode 135 may be connected to the second metal pattern 130 and may be connected to the ball land pad 115 by vertically penetrating a portion of the body of the package substrate 100. The second wiring pattern 145 may not be connected to the metal post 165 and may be connected to another wiring pattern in the body of the package substrate 100 to transmit electrical signals. The first metal post 165 may be insulated by an organic or insulation material of the body of the substrate 100. The first and second wiring patterns 140 and 145 may include copper (Cu).

The metal post 165 may have a shape that a via hole 163 penetrating the package substrate 100 from the first surface 100a to the second surface 100b is filled with a via metal 164. In an embodiment, the via metal 164 filling the via hole 163 may include copper (Cu). The metal post 165 may be a pillar that vertically penetrates the package substrate 100. The metal post 165 may include a first end 165a adjacent to the first surface 100a of the package substrate 100 and a second end 165b adjacent to the second surface 100b of the package substrate 100.

The first end 165a of the metal post 165 may have a first protrusion P1 protruding from the first surface 100a of the package substrate 100 by a predetermined height. In addition, the second end 165b of the metal post 165 opposite to the first end 165a may have a second protrusion P2 protruding from the second surface 100b of the package substrate 100 by a predetermined height. Although FIG. 1 illustrates an example in which the first protrusion P1 and the second protrusion P2 have the same height, but not limited thereto. As described above, a portion of the side wall of the metal post 165 may be electrically coupled to the external connection terminal 185 through the first wiring pattern 140 disposed in the body of the package substrate 100.

The first semiconductor chip 150 may be disposed over the first surface 100a of the package substrate 100. Active devices such as transistors may be disposed in the first semiconductor chip 150. In some cases, passive devices such as capacitors or resistors may also be disposed in the first semiconductor chip 150.

The first semiconductor chip 150 may include a first front side portion 150a in which active devices are disposed and a first back side portion 150b that is opposite to the front side portion 150a. A plurality of first connection pads 155 may be disposed on the first front side portion 150a of the first semiconductor chip 150. Referring back to FIG. 2, the first connection pads 155 may be arrayed in at least two columns which are located in a central portion of the first semiconductor chip 150. The at least two columns in which the first connection pads 155 are arrayed may be spaced apart from each other by a first distance (d1). The first connection pad 155 may be electrically coupled to the first end 165a of the metal post 165.

The second semiconductor chip 160 may be disposed on the second surface 100b of the package substrate 100. The first and second semiconductor chips 150 and 160 may be the same type semiconductor chips, but not limited thereto. The second semiconductor chip 160 may include a second front side portion 160a and a second back side portion 160b that are opposite to each other. The second front side portion 160a may include active regions where the active devices are disposed. A plurality of second connection pads 157 may be disposed on the second front side portion 160a of the second semiconductor chip 160. Referring again to FIG. 2, the second connection pads 157 may be arrayed in at least two columns located in a central portion of the second semiconductor chip 160. Further, the at least two columns in which the second connection pads 157 are arrayed may be spaced apart from each other by a second distance (d2). The second connection pad 157 of the second semiconductor chip 160 may be electrically coupled to the second end 165b of the metal post 165. As the first semiconductor chip 150 is connected to the first ends 165a of the metal posts 165 and the second semiconductor chip 160 is connected to the second ends 165b of the metal posts 165, the first and second semiconductor chips 150 and 160 may be electrically coupled to each other through the metal posts 165. As shown in FIG. 2, the first and second semiconductor chips 150 and 160 may be disposed so that the first connection pads 155 of the first semiconductor chip 150 respectively face the second connection pads 157 of the second semiconductor chip 160. In an embodiment, in the event that the first and second semiconductor chips 150 and 160 are the same type semiconductor chips, the first and second connection pads 155 and 157 may be arranged to be symmetrical with each other so that the first connection pad 155 and the second connection pad 157 performing the same function are connected to each other.

The first semiconductor chip 150 and the first insulating pattern 107a which are disposed on the first surface 100a of the package substrate 100 may be covered with a first flexible molding member 170. The second semiconductor chip 160 and a portion of the second insulating pattern 107b which are disposed on the second surface 100b of the package substrate 100 may be covered with a second flexible molding member 180. The first flexible molding member 170 and the second flexible molding member 180 may include a flexible material that can be bent when an external force is applied to the package substrate 100. The flexible material may have a tensile elasticity modulus (Young's modulus) of 0.01 GPa to 0.1 GPs range. As the tensile elasticity modulus of the flexible material employed in the embodiment is less than the tensile elasticity modulus (i.e., 20 GPa to 30 GPa) of molding epoxy compound (EMC), the semiconductor package 1000 may be easily bent when the external force is applied to the semiconductor package 1000.

In an embodiment, the flexible material having the tensile elasticity modulus described above may include silicone resin or silicone rubber. The first and second flexible molding members 170 and 180 may allow the semiconductor package 1000 to be bent and may physically or chemically protect the first semiconductor chip 150 and the second semiconductor chip 160 from an external environment. Spaces between the package substrate 100 and the first and second semiconductor chips 150 and 160 may be fully filled with the first flexible molding member 170 and the second flexible molding member 180.

The ball land pads 115 disposed on the second surface 100b of the package substrate 100 may be connected to the external connection terminals 185. Although not shown in the figures, the external connection terminals 185 may enables the semiconductor package 1000 to be mounted on a printed circuit board (PCB). The external connection terminal 185 may include a solder ball. The external connection terminals 185 may be disposed to downwardly protrude from a bottom surface level of the second flexible molding member 180.

The semiconductor package 1000 according to an embodiment may include a fix portion 190. The fix portion 190 may correspond to a part which includes the metal posts 165 penetrating the package substrate 100 and the first and second semiconductor chips 150 and 160 connected to first and second ends 165a and 165b of the metal posts 165. The remaining part except the fix portion 190 may be understood as a part which is capable of warping or bending. In an embodiment, the flexible package substrate 100 except the fix portion 190 and the first and second flexible molding members 170 and 180 may warp or bend. As each of the package substrate 100 and the first and second flexible molding members 170 and 180 includes a flexible material, the semiconductor package 1000 may warp or bend upward or downward. In addition, as the first semiconductor chip 150 and the second semiconductor chip 160 are connected to and supported by the metal posts 165 having vertical pillar shapes, the first and second semiconductor chips 150 and 160 may not warp or bend even when the semiconductor package 1000 warps or bends due to an external force.

Referring again to FIGS. 3 and 4, a stress relief action of the semiconductor package 1000 according to an embodiment is illustrated. When an external force (F1 in FIG. 3) is applied to the semiconductor package 1000 in a first direction, the first flexible molding member 170 and the package substrate 100 may be compressed and bent inward as indicated by first arrows (a1). Further, the second flexible molding member 180 disposed at an opposite side to the first flexible molding member 170 may be tensed and bent outward as indicated by second arrows (a2). Alternatively, when the external force (F2 in FIG. 4) is applied to the semiconductor package 1000 in a second direction, the first flexible molding member 170 and the package substrate 100 may be tensed and bent outward as indicated by third arrows (b1) and the second flexible molding member 180 disposed at an opposite side to the first flexible molding member 170 may be compressed and bent inward as indicated by fourth arrows (b2).

As shown in FIG. 3 or FIG. 4, in a flexible region 195, the semiconductor package 1000 may warp or bend upward or downward according to the direction of the external forces (F1, F2). Nevertheless, since the first and second semiconductor chips 150 and 160 in the fix portion 190 are connected to and supported by the metal posts 165 which is vertically disposed, the semiconductor chips 150 and 160 may be fixed without being warped or bent.

Figure 5:
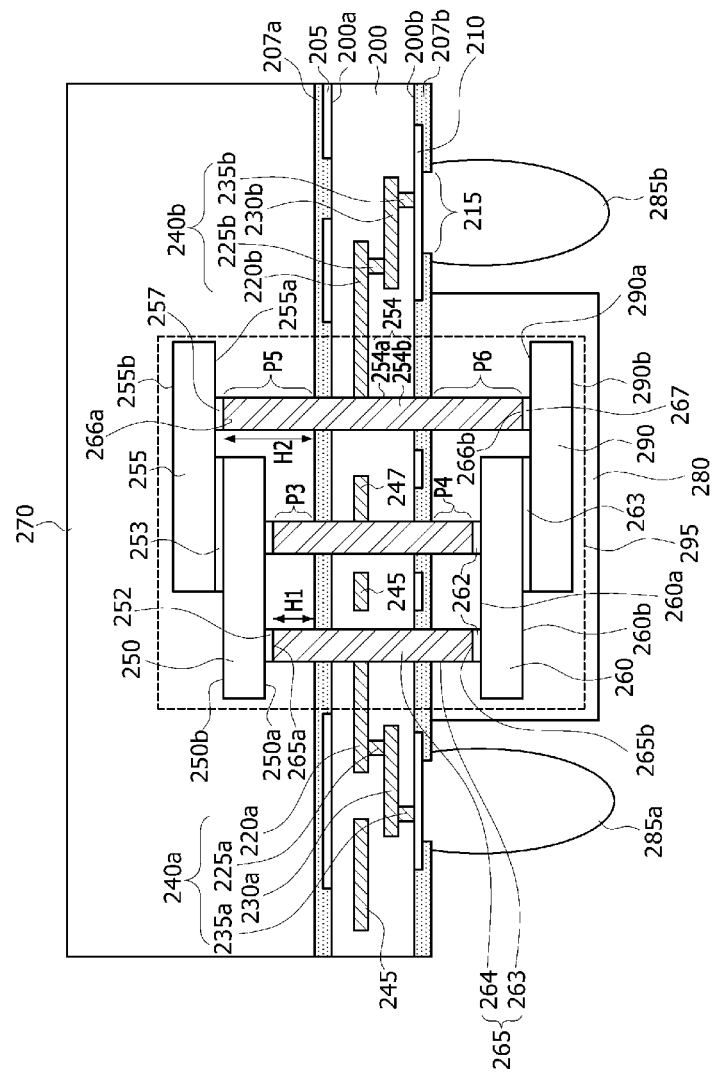
FIG. 5 is a cross-sectional view illustrating a semiconductor package according to an embodiment.

Referring to FIG. 5, a cross-sectional view illustrating a semiconductor package 2000 according to an embodiment is illustrated.

In FIG. 5, the semiconductor package 2000 may include a package substrate 200; a first semiconductor chip 250; a second semiconductor chip 260; first metal posts 265 electrically connecting the first semiconductor chip 250 to the second semiconductor chip 260; a third semiconductor chip 255 disposed on a surface of the first semiconductor chip 250 opposite to the second semiconductor chip 260; a fourth semiconductor chip 290 disposed on a surface of the second semiconductor chip 260 opposite to the first semiconductor chip 250; and a second metal post 254 electrically coupling the third semiconductor chip 255 to the fourth semiconductor chip 290.

The package substrate 200 may include a body and may be a plate type member having first and second surfaces 200a and 200b that are opposite to each other. The package substrate 200 may be an organic substrate including a flexible organic material or an insulating substrate including a flexible insulating material. In an embodiment, the organic material may include at least one selected from the group consisting of polymer resin, epoxy resin and plastic. The body of the package substrate 200 may have a structure including a plurality of organic thin films which are stacked. First circuit patterns 205 may be disposed on the first surface 200a of the package substrate 200. Further, second circuit patterns 210 may be disposed on the second surface 200b of the package substrate 200. The first circuit pattern 205 and the second circuit pattern 210 may include copper (Cu).

A first insulating pattern 207a covering the first circuit patterns 205 may be disposed on the first surface 200a of the package substrate 200. A second insulating pattern 207b partially covering the second circuit pattern 210 may be disposed on the second surface 200b of the package substrate 200. The second insulating pattern 207b may be disposed to expose some of the second circuit patterns 210. The exposed second circuit patterns 210 may act as ball land pads 215. The first and second insulating patterns 207a and 207b may include a solder resist material.

The first metal post 265 may be configured to include a first via hole 263 penetrating the package substrate 200 from the first surface 200a to the second surface 200b and a first via metal 264 filling the first via hole 263. In an embodiment, the first via metal 264 filling the first via hole 263 may include copper (Cu). The first metal post 265 may include a first end 265a disposed on the first surface 200a of the package substrate 200 and a second end 265b disposed on the second surface 200b of the package substrate 200. The first end 265 of the first metal post 265 may have a first protrusion P3 protruding from the first surface 200a of the package substrate 200. The second end 265b may have a second protrusion P4 protruding from the second surface 200b of the package substrate 200.

The second metal post 254 may be configured to include a second via hole 254a penetrating the package substrate 200 from the first surface 200a to the second surface 200b and a second via metal 254b filling the second via hole 254a. The second metal post 254 may be spaced apart from one of the first metal posts 265 by a predetermined distance. In an embodiment, the second via metal 254b may include copper (Cu). The second metal post 254 may include a first end 266a disposed on the first surface 200a of the package substrate 200 and a second end 266b disposed on the second surface 200b of the package substrate 200. The first end 266a of the second metal post 254 may include a third protrusion P5 protruding from the first surface 200a of the package substrate 200. In addition, the second end 266b may include a fourth protrusion P6 protruding from the second surface 200b of the package substrate 200. A height of the third protrusion P5 and the fourth protrusion P6 of the second metal post 254 may be greater than that of the first and fourth protrusions P3 and P4 of the first metal post 265.

More specifically, as illustrated in FIG. 5, the first and second protrusions P3 and P4 of the first metal post 265 may be disposed to have a first height H1 from a surface of the first insulating pattern 207a and a surface of the second insulating pattern 207b. The second metal post 254 has to extend to reach the third semiconductor chip 255 and the fourth semiconductor chip 290. Accordingly, the third protrusion P5 and the fourth protrusion P6 of the second metal post 254 may be disposed to have a second height H2 which is greater than the first height H1 from the surfaces of the first and second insulating patterns 207a and 207b.

At least two semiconductor chips, for example, the first and third semiconductor chips 250 and 255 may be disposed over the first surface 200a of the package substrate 200. For example, the first semiconductor chip 250 may be disposed on the first surface 200a of the package substrate 200. In addition, the third semiconductor chip 255 may be stacked over the first semiconductor chip 255 using a first adhesion member 253 between the first and third semiconductor chips 250 and 255. Further, although not shown in the figure, additional semiconductor chips may be stacked on the third semiconductor chip 255. The first and third semiconductor chips 250 and 255 may be stacked to constitute a step structure. In an embodiment, the third semiconductor chip 255 may be stacked on the first semiconductor chip 250 so that an edge of the third semiconductor chip 255 laterally protrudes from a sidewall of the first semiconductor chip 250. Accordingly, a portion of the third semiconductor chip 255 may not overlap with the first semiconductor chip 250 to act as an overhang.

Active devices such as transistors may be disposed in the first semiconductor chip 250 and the third semiconductor chip 255. The first semiconductor chip 250 may include a first front side portion 250a and a back side portion 250b that are opposite to each other. The front side portion 250a may be an active region in which the active devices are disposed. A plurality of first connection pads 252 may be disposed on the first front side portion 250a of the first semiconductor chip 250. The first connection pads 252 may be arrayed in at least two columns located in a central portion of the first semiconductor chip 250. The first connection pads 252 of the first semiconductor chip 250 may be electrically coupled to the first ends 265a of the first metal posts 265. The third semiconductor chip 255 disposed on the first semiconductor chip 250 may include a third front side portion 255a and a third back side portion 255b that are opposite to each other. The third front side portion 255a may be an active region in which active devices are disposed. A third connection pad 257 may be disposed on the third front side portion 255a of the third semiconductor chip 250. The third connection pad 257 may be disposed on the third front side portion 255a of the overhang of the third semiconductor chip 255.

At least two semiconductor chips 260 and 290 may be disposed on the second surface 200b of the package substrate 200. For example, the second semiconductor chip 260 may be disposed to be adjacent to the second surface 200b of the package substrate 200. In addition, the fourth semiconductor chip 290 may be attached to the second semiconductor chip 260 using a second adhesion member 263 between the second and fourth semiconductor chips 260 and 290. Further, additional semiconductor chips may be stacked on the third semiconductor chip 255. The second and fourth semiconductor chips 260 and 290 may be disposed to constitute a step structure. Accordingly, an edge of the fourth semiconductor chip 290 may laterally protrude from a sidewall of the second semiconductor chip 260 to act as an overhang.

The second semiconductor chip 260 may include a second front side portion 260a and a second back side portion 260b that are opposite to each other. The second front side portion 260a may be an active region in which active devices are disposed. A plurality of second connection pads 262 may be disposed on the second front side portion 260a of the second semiconductor chip 260. The second connection pad 262 may be arrayed in at least two columns located at a central portion of the second semiconductor chip 260 and may be vertically aligned with the first connection pads 252 of the first semiconductor chip 250.

The fourth semiconductor chip 290 may include a fourth front side portion 290a and a fourth back side portion 290b that are opposite to each other. The fourth front side portion 290a may be an active region in which active devices are disposed. A fourth connection pad 267 may be disposed on the fourth front side portion 290a of the fourth semiconductor chip 290. The fourth connection pad 267 may be disposed on the overhang of the fourth semiconductor chip 290 that does not overlap with the second semiconductor chip 260.

The first and second semiconductor chips 250 and 260 may be electrically coupled to each other through the first metal posts 265 without using any adhesion members like an adhesive. More specifically, the first semiconductor chip 250 may be connected to the first ends 265a of the first metal posts 265 through the first connection pads 252. Further, the second semiconductor chip 260 may be connected to the second ends 265b of the first metal posts 265 through the second connection pads 262. Accordingly, the first and second semiconductor chips 250 and 260 may be electrically coupled to each other through the first metal posts 265.

In addition, the third and fourth semiconductor chips 255 and 290 may also be electrically coupled to each other through the second metal post 254 without using any adhesion members like an adhesive. For example, the third semiconductor chip 255 may be connected to the first end 266a of the second metal post 254 through the first connection pad 257. Further, the fourth semiconductor chip 290 may be connected to the second end 266b of the second metal post 254 through the second connection pad 267. Accordingly, the third and fourth semiconductor chips 255 and 290 may be electrically coupled to each other through the second metal post 254.

A side wall of the first metal post 265 may be connected to a first wiring pattern 240a which is disposed in the body of the package substrate 200. Thus, the first metal post 265 may be connected to a first external connection terminal 285a attached to the ball land pad 215. Further, a side wall of the second metal post 254 may be connected to a second wiring pattern 240b which is disposed in the body of the package substrate 200. Thus, the second metal post 254 may be connected to a second external connection terminal 285b attached to the ball land pad 215. More specifically, wiring patterns 240a, 240b, 245 and 247 may be disposed in the body of the package substrate 200. These wiring patterns 240a, 240b, 245 and 247 may include the first to fourth wiring patterns 240a, 240b, 245 and 247. The first wiring pattern 240a may electrically couple the first metal post 265 to the first external connection terminal 285a. The first wiring pattern 245a may include a first metal pattern 220a, a first via electrode 225a, a second metal pattern 230a and a second via electrode 235a. The second wiring pattern 240b may electrically couple the second metal post 254 to the second external connection terminal 285b. The second wiring pattern 240b may include a third metal pattern 220b, a third via electrode 225b, a fourth metal pattern 230b and a fourth via electrode 235b. The third wiring pattern 245 is not connected any of the first metal post 265 and the second metal post 254. The third wiring pattern 245 may be connected to other wiring patterns in the body of the package substrate 200 to transmit electrical signals. The fourth wiring pattern 247 may be partially connected to the first metal post 265 or the second metal post 254 and may be connected to other wiring patterns. Remaining portions of the first metal post 265 or the second metal post 254, which are not in contact with the first wiring pattern 240a, the second wiring pattern 240b or the fourth wiring pattern 247 in the body of the package substrate, may be insulated by an organic material or an insulation material of the body of the package substrate 200. The first to fourth wiring patterns 240a, 240b, 245 and 247 may include copper (Cu).

The first semiconductor chip 250, the third semiconductor chip 255 and the first insulating pattern 207a may be covered with a first flexible molding member 270. The second semiconductor chip 260, the fourth semiconductor chip 290 and a part of the second insulating pattern 207b may be covered with a second flexible molding member 280. A space between the package substrate 200 and the first and third semiconductor chips 250 and 255 may be fully filled with the first flexible molding member 270. Similarly, a space between the package substrate 200 and the second and fourth semiconductor chips 260 and 290 may be fully filled with the second flexible molding member 280. The first and second flexible molding member 270 and 280 may include a flexible material capable of bending when an external force is applied to the package substrate 2000 in an upward or downward direction. The flexible material may have a Young's modulus of 0.01 GPa to 0.1 GPa range. In an embodiment, the flexible material may include silicone resin or silicone rubber. These first and second flexible molding members 270 and 280 may allow the semiconductor package 2000 to be bent and may mechanically and chemically protect the first to fourth semiconductor chips 250, 260, 255 and 290. The ball land pads 215 disposed on the second surface 200b of the package substrate 200 may be connected to the first and second external connection terminals 285a and 285b.

The semiconductor package 2000 may include a fix portion 295. The fix portion 295 may include the first metal posts 265 penetrating the package substrate 200, the first and second semiconductor chips 250 and 260 connected to the first and second ends 265a and 265b of the first metal posts 265, and the third and fourth semiconductor chips 255 and 290 connected to both ends of the second metal post 254.

As the package substrate 200, the first flexible molding member 270 and the second flexible molding member 280 include flexible materials, the semiconductor package 2000 may warp or bend upward or downward. However, in the fix portion 295, the first, second, third and fourth semiconductor chips 250, 260, 255 and 290 are connected to and supported by the first and second metal posts 265 and 254. Thus, warpage of the semiconductor chips may be suppressed.

The semiconductor packages described above may be applied to various electronic systems.

Figure 6:
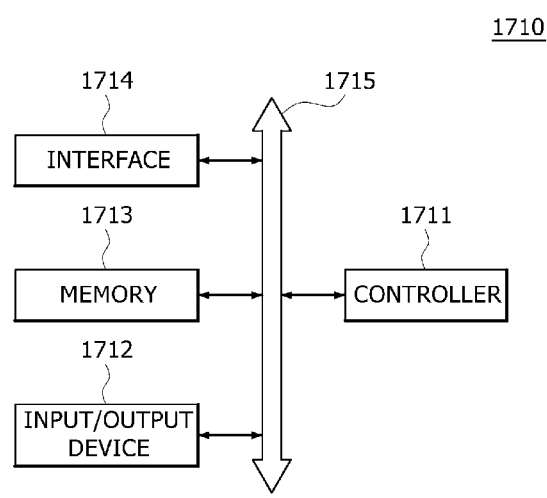
FIG. 6 is a block diagram illustrating a representation of an example of an electronic system including at least one of semiconductor packages in accordance with some embodiments.

Referring to FIG. 6, the semiconductor package in accordance with an embodiment may be applied to an electronic system 1710. The electronic system 1710 may include a controller 1711, an input/output unit 1712, and a memory 1713. The controller 1711, the input/output unit 1712 and the memory 1713 may be electrically coupled with one another through a bus 1715 providing a path through which data are transmitted.

For example but not limited to, the controller 1711 may include at least any one of at least one microprocessor, at least one digital signal processor, at least one microcontroller, and logic devices capable of performing the same functions as these components. At least one of the controller 1711 and the memory 1713 may include at least any one of the semiconductor packages according to the embodiments of the present disclosure. The input/output unit 1712 may include at least one selected among a keypad, a keyboard, a display device, a touch screen and so forth. The memory 1713 is a device for storing data. The memory 1713 may store data and/or commands to be executed by the controller 1711, and the likes.

The memory 1713 may include a volatile memory device such as a DRAM and/or a nonvolatile memory device such as a flash memory. For example, a flash memory may be mounted to an information processing system such as a mobile terminal or a desk top computer. The flash memory may constitute a solid state disk (SSD). In this example, the electronic system 1710 may stably store a large amount of data in a flash memory system.

The electronic system 1710 may further include an interface 1714 configured to transmit and receive data to and from a communication network. The interface 1714 may be a wired or wireless type. For example, the interface 1714 may include an antenna or a wired or wireless transceiver.

The electronic system 1710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

In an embodiment wherein the electronic system 1710 is an equipment capable of performing wireless communication, the electronic system 1710 may be used in a communication system such as, for example but not limited to, CDMA (code division multiple access), GSM (global system for mobile communications), NADC (north American digital cellular), E-TDMA (enhanced-time division multiple access), WCDMA (wideband code division multiple access), CDMA2000, LTE (long term evolution) and Wibro (wireless broadband Internet).

Figure 7:
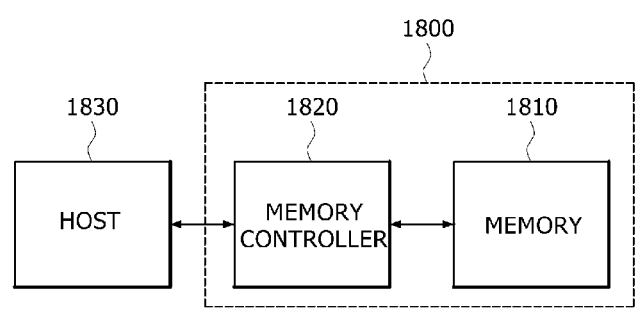
FIG. 7 is a block diagram illustrating a representation of an example of an electronic system including at least one of semiconductor packages in accordance with some embodiments.

Referring to FIG. 7, the semiconductor package in accordance with the embodiments may be provided in the form of a memory card 1800. For example, the memory card 1800 may include a memory 1810 such as a nonvolatile memory device and a memory controller 1820. The memory 1810 and the memory controller 1820 may store data or read stored data.

The memory 1810 may include at least any one among nonvolatile memory devices to which the packaging technology of the embodiments of the present disclosure is applied. The memory controller 1820 may control the memory 1810 such that stored data is read out or data is stored in response to a read/write request from a host 1830.

Embodiments of the present disclosure have been disclosed above for illustrative purposes. Those skilled in the art will appreciate that various modifications, additions and substitutions are possible, without departing from the scope and spirit of the present disclosure as disclosed in the accompanying claims.

What is claimed is:

1. A semiconductor package comprising:
a flexible package substrate including a first surface and a second surface;
a metal post penetrating the flexible package substrate from the first surface toward the second surface and including a first protrusion that protrudes from the first surface and a second protrusion that protrudes from the second surface;
a first semiconductor chip connected to the first protrusion;
a second semiconductor chip connected to the second protrusion;
a first flexible molding member covering the first semiconductor chip and the first surface of the flexible package substrate;
a second flexible molding member covering the second semiconductor chip disposed on the second surface of the flexible package substrate;
an external connection terminal disposed on the second surface of the flexible package substrate; and
a plurality of wiring patterns disposed in the flexible package substrate to connect the metal post to the external connection terminal.

2. The semiconductor package of claim 1, wherein the flexible package substrate is an organic substrate including a flexible organic material or an insulation substrate including a flexible insulation material.

3. The semiconductor package of claim 2, wherein the organic substrate includes at least one organic material selected from a group consisting of polymer resin, epoxy resin and plastic.

4. The semiconductor package of claim 1, wherein the metal post is disposed to have a vertical pillar shape penetrating the flexible package substrate.

5. The semiconductor package of claim 1, wherein the first semiconductor chip is connected and fixed to the first protrusion and the second semiconductor chip is connected and fixed to the second protrusion.

6. The semiconductor package of claim 1,
wherein the first semiconductor chip includes a first front side portion on which at least one first connection pad is disposed and a first back side portion which is opposite to the first front side portion;
wherein the second semiconductor chip includes a second front side portion on which at least one second connection pad is disposed and a second back side portion which is opposite to the second front side portion; and
wherein the first and second semiconductor chips are disposed so that the first and second connection pads face each other.

7. The semiconductor package of claim 6,
wherein the at least one first connection pad includes a plurality of first connection pads;
wherein the at least one second connection pad includes a plurality of second connection pads;
wherein the plurality of first connection pads are arrayed in at least two columns located at a central portion of the first front side portion of the first semiconductor chip; and
wherein the plurality of second connection pads are arrayed in at least two columns located at a central portion of the second front side portion of the second semiconductor chip.

8. The semiconductor package of claim 6, wherein the at least one first connection pad is disposed to be vertically aligned with the at least one second connection pad so that the at least one first connection pad and the at least one second connection pad are symmetric with respect to the flexible package substrate.

9. The semiconductor package of claim 1, wherein at least one of the first and second flexible molding members includes a flexible material having a Young's modulus of about 0.01 GPa to about 0.1 GPa.

10. The semiconductor package of claim 9, wherein the flexible material includes silicone resin or silicone rubber.

11. The semiconductor package of claim 1, wherein the first flexible molding member includes a flexible material that can be bent in response to an external force applied to the flexible package substrate.

12. The semiconductor package of claim 1, wherein the second flexible molding member includes a flexible material that can be bent in response to an external force applied to the flexible package substrate.

13. The semiconductor package of claim 1, wherein the first flexible molding member fully fills a space between the flexible package substrate and the first semiconductor chip which are spaced apart from each other by the first protrusion of the metal post.

14. The semiconductor package of claim 1, wherein the second flexible molding member fully fills a space between the flexible package substrate and the second semiconductor chip which are spaced apart from each other by the second protrusion of the metal post.

* * * * *